United States Patent [19]
Park

[11] Patent Number: 6,013,554
[45] Date of Patent: Jan. 11, 2000

[54] METHOD FOR FABRICATING AN LDD MOS TRANSISTOR

[75] Inventor: Young-Tack Park, Bucheon, Rep. of Korea

[73] Assignees: Anam Semiconductor Inc., Seoul, Rep. of Korea; Amkor Technology, Inc., Chandler, Ariz.

[21] Appl. No.: 09/223,238

[22] Filed: Dec. 30, 1998

[30] Foreign Application Priority Data

Dec. 30, 1997 [KR] Rep. of Korea .................. 97-78393

[51] Int. Cl.$^7$ .................................. H01L 21/336
[52] U.S. Cl. ............................. 438/305; 438/231
[58] Field of Search ............................. 438/231, 305, 438/FOR 188

[56] References Cited
U.S. PATENT DOCUMENTS 5,597,752  1/1997  Niwa .

*Primary Examiner*—George Fourson
*Assistant Examiner*—Joannie A. Garcia
*Attorney, Agent, or Firm*—Skjerven, Morrill, MacPherson, Franklin & Friel LLP; Alan H. MacPherson; Carmen C. Cook

[57] ABSTRACT

A method for fabricating an LDD MOS transistor includes the steps of forming a gate conductor on a gate oxide layer formed on a substrate, forming a heavily doped source/drain region in the substrate using the gate conductor as a mask, thermally oxidizing the surface of the gate conductor and the substrate, thereby forming a reduced dimension gate conductor, and forming a lightly doped source/drain region in the substrate using the reduced dimension gate conductor as a mask. In the alternate, the method further includes the step of removing the oxidized surface of the gate conductor and the substrate using a cleaning process to expose the reduced dimension gate conductor before forming the lightly doped source/drain region. The thickness of the thermally oxidized surface of the gate conductor is about 500 Å~5000 Å.

21 Claims, 4 Drawing Sheets

METHOD FOR FABRICATING AN LDD MOS TRANSISTOR

BACKGROUND OF THE INVENTION

1. Field of the Invention

The present invention relates to the manufacture of semiconductor devices, and more particularly, to a method for forming an LDD structure and a heavily doped source/drain structure on a semiconductor substrate.

2. Background of the Invention

A metal oxide semiconductor field effect transistor (MOS transistor) comprises a semiconductor substrate, in which a source/drain region and on which a gate structure are formed. MOS transistors can be either N-channel devices or P-channel devices. In CMOS (complementary metal oxide semiconductor) technology, both N-channel devices and P-channel devices are employed to form logic circuits.

Lightly doped drain (LDD) transistors having an LDD region inside the heavily doped source/drain regions are widely used. FIGS. 1a to 1d illustrate, in cross-section, a portion of a semiconductor device as it undergoes conventional processing steps in sequence for making an LDD MOS transistor.

Referring to FIG. 1a, a gate oxide layer 2 and a polysilicon layer 3 are, in this order, formed on a semiconductor substrate 1. The gate oxide layer 2 and the polysilicon layer 3 are etched using a photolithography process so that a gate structure 21 is formed as shown in FIG. 1b. Subsequently, an LDD region 4 is formed by doping the substrate 1 with a dopant of either N-type or P-type impurities using low levels of implant energy while using the gate structure 21 as a mask as shown in FIG. 1b.

Following the above, referring to FIG. 1c, an insulating layer 5' is deposited on the substrate 1 using an LPCVD (low pressure chemical vapor deposition) process. Then, the insulating layer 5' is anisotropically etched to form an insulating spacer 5 on the sidewall of the gate structure 21. Next, a dopant of the same impurity type as the LDD region 4 is introduced, using high levels of implant energy, into the substrate 1 while both the gate structure 21 and the insulating spacer 5 are used as a mask. A heavily doped source/drain region 6 is thus formed as shown in FIG. 1d.

Finally, although not shown in the drawings, an insulating layer is deposited on the substrate 1 and is then etched to form contact holes through which electrodes contact both the polysilicon layer 3 of the gate structure 21 and the source/drain region 6.

In the above described prior art process, with the increasing miniaturization of semiconductor devices, it has become more difficult to form a gate structure pattern using a masking process as described above, particularly when the degree of integration is less than 0.3 $\mu$m.

In addition, in the above described process, because the LDD region is formed after the formation of the gate structure, it is necessary to configure the insulating spacer around the gate structure which increases the critical dimension, i.e. the length, of the gate structure. The increase in the critical dimension of the gate structure limits the degree to which the semiconductor device can be integrated.

SUMMARY OF THE INVENTION

The present invention has been made in an effort to solve the above-described problem.

In accordance with the present invention, a method for fabricating an LDD MOS transistor is provided which can increase the degree of integration of a semiconductor device. The method includes the steps of forming a gate conductor on a gate oxide layer formed on a substrate, forming a heavily doped source/drain region in the substrate using the gate conductor as a mask, thermally oxidizing the surface of the gate conductor and the substrate, thereby forming a reduced dimension gate conductor, and forming a lightly doped source/drain region in the substrate using the reduced dimension gate conductor as a mask. In one embodiment, the lightly doped source/drain region is formed by implanting a dopant into the substrate through the thermally oxidized surface of the substrate at a high implant energy while using the reduced dimension gate conductor as a mask.

In an alternate embodiment, the method includes the step of removing the oxidized surface of the gate conductor and the substrate using a cleaning process to expose the reduced dimension gate conductor before forming the lightly doped source/drain region. Furthermore, in yet another embodiment, subsequent to removing the oxidized surface of the gate conductor and the substrate, the lightly doped source/drain region is formed by implanting a dopant into the substrate at a low implant energy while using the reduced dimension gate conductor as a mask.

According to a feature of the present invention, the thickness of the thermally oxidized surface of the gate conductor and the substrate is about 500 Å~5000 Å.

The present invention is better understood upon consideration of the detailed description below and the accompanying drawings.

BRIEF DESCRIPTION OF THE DRAWINGS

The accompanying drawings, which are incorporated in and constitute a part of the specification, illustrate the embodiments of the present invention, and, together with the description, serve to explain the principles of the invention.

DETAILED DESCRIPTION

This application is substantially similar to Korean Patent Application No. 97-78393 filed on Dec. 30, 1997, the disclosure of which is incorporated herein by reference in its entirety.

FIGS. 2a to 2f illustrate the sequential processing steps of fabricating an LDD MOS transistor according to the embodiments of the present invention.

Figure 1A:
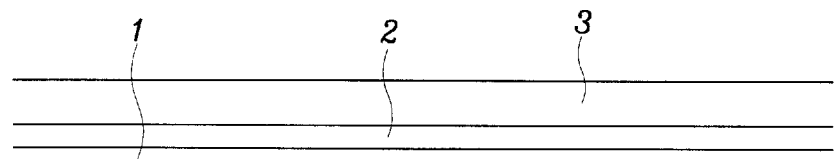
FIGS. 1a to 1d illustrate, in cross-section, a portion of a semiconductor device as it undergoes sequential processing steps for forming a conventional LDD MOS transistor.
Figure 1B:
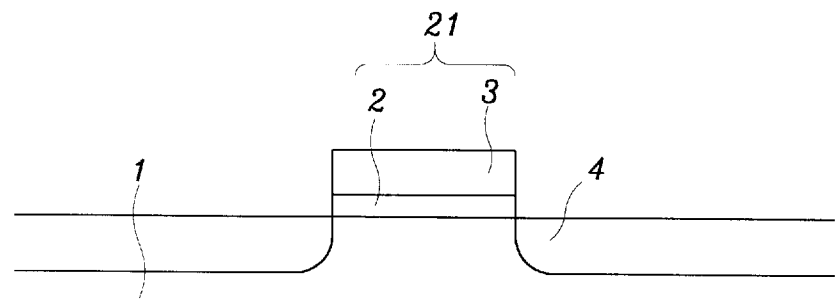
Figure 1C:
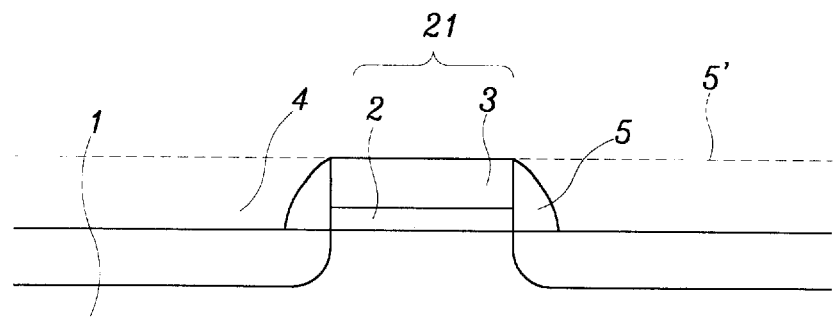
Figure 1D:
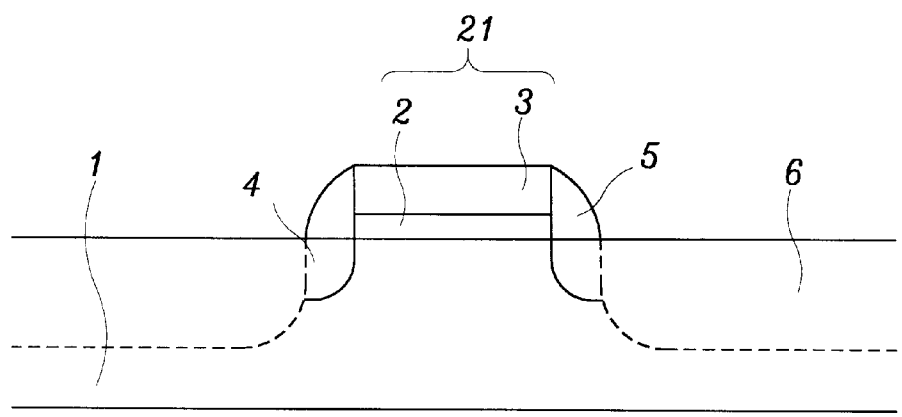
Figure 2A:
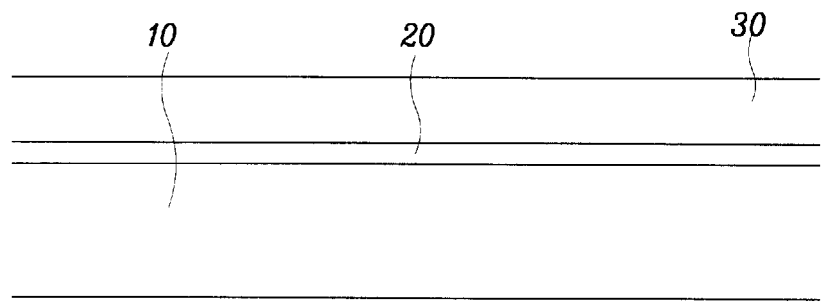
FIGS. 2a to 2f illustrate, in cross-section, a portion of a semiconductor device as it undergoes sequential processing steps for forming an LDD MOS transistor in accordance with the embodiments of the present invention.
Figure 2B:
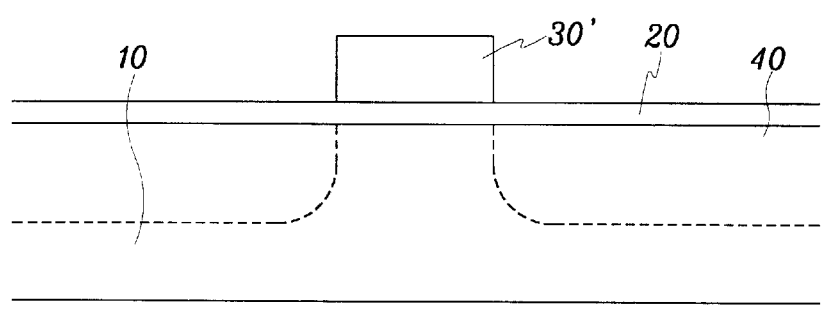

Referring to FIG. 2a, a gate oxide layer 20 and a polysilicon layer 30 are, in this order, formed on a semiconductor substrate 10. The polysilicon layer 30 is etched through a photolithography process such that a gate conductor 30' is formed as shown in FIG. 2b. A heavily doped source/drain region 40 is formed by introducing either an N-type dopant or a P-type dopant through gate oxide layer 20 and into the substrate 10 using a high level of implant energy while the gate conductor 30' is used as a mask. In one embodiment, the implantation is performed at an implant energy of 40–80 keV and using an impurity dose of 1E14 to 1E18 ions/cm$^2$.

Figure 2C:
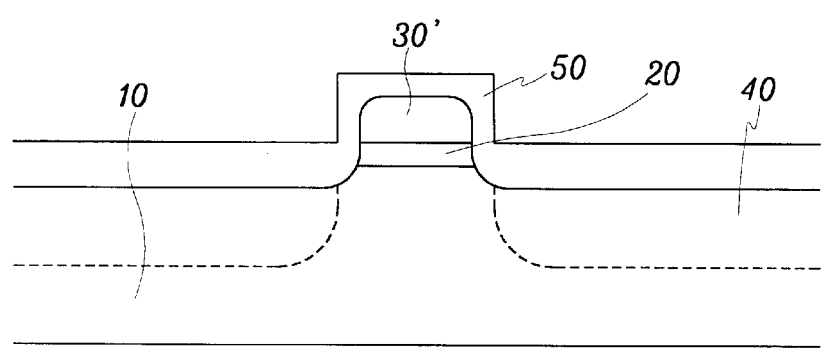

Next, referring to FIG. 2c, the gate conductor 30' is thermally oxidized by heating the substrate as well as the gate conductor 30' such that the peripheries of the gate conductor 30' and the substrate surface above the heavily doped source/drain region 40 are transformed into a thermally oxidized layer 50 having a thickness of about 500 Å~5000 Å. In one embodiment, the thermal oxidation process is carried out in an $H_2/O_2$ ambient and at a temperature in the range of 900–1050° C. The thickness of the thermally oxidized layer 50 can be adjusted within the range of about 500 Å~5000 Å by varying the oxidation time of the thermal oxidation process. A reduced dimension gate conductor 30" is thus formed underneath the thermally oxidized layer 50. In one embodiment, the reduced dimension gate conductor 30" has a critical dimension (i.e. a length) in the range of 0.15–0.25 μm.

Figure 2D:
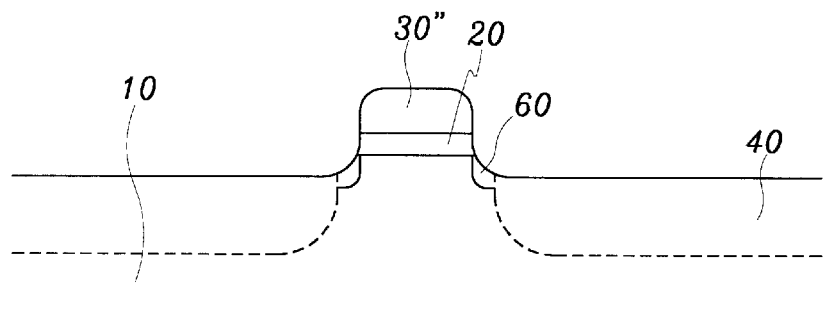
Figure 2E:
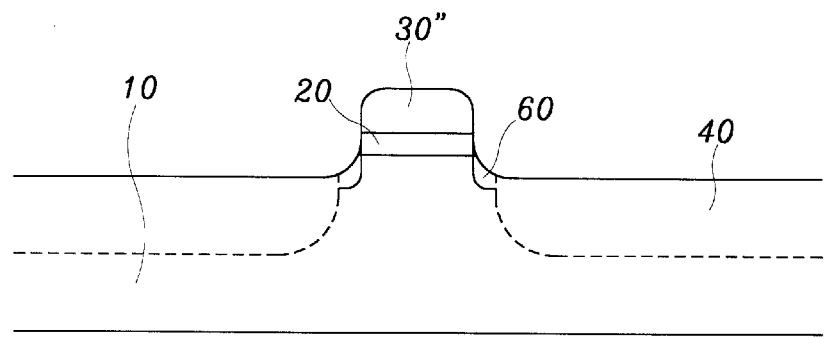

Subsequent to the thermal oxidation step, a lightly doped source/drain region 60 (see FIG. 2e) is formed in accordance with one of two embodiments of the present invention illustrated in FIGS. 2c and 2d. In one embodiment, an ion implantation process is carried out on the structure of FIG. 2c. The lightly doped source/drain region 60 is formed by introducing a dopant of the same impurity type as the heavily doped source/drain region 40 into the substrate 10 through the thermally oxidized layer 50 using a high level of implant energy. For example, the implantation can be performed at an implant energy of 400–900 keV and using an impurity dose of 1E12–1E13 ions/cm$^2$. The thermally oxidized layer 50 is then removed through a cleaning process using, for example, hydrofluoric (HF) acid. The resultant structure, including the reduced dimension gate conductor 30" and the lightly doped source/drain region 60, is shown in FIG. 2e.

In an alternate embodiment, subsequent to the thermal oxidation step, the thermally oxidized layer 50 is removed through a cleaning process as previously described to expose the reduced dimension gate conductor 30" as shown in FIG. 2d. An ion implantation process is then carried out on the structure of FIG. 2d. The lightly doped source/drain region 60 is formed by introducing a dopant of the same impurity type as the heavily doped source/drain region 40 into the substrate 10 using a low level of implant energy. For example, the implantation can be performed at an implant energy of 20–100 keV and using an impurity dose of 1E12–1E14 ions/cm$^2$. FIG. 2e illustrates the resultant structure.

In both of the above described embodiments, the reduced dimension gate conductor 30" serves as a mask for the implantation of the lightly doped source/drain region 60. Accordingly, as shown in FIG. 2e, the lightly doped source/drain region 60 is formed with a width equal to the thickness of the removed thermally oxidized layer 50.

Figure 2F:
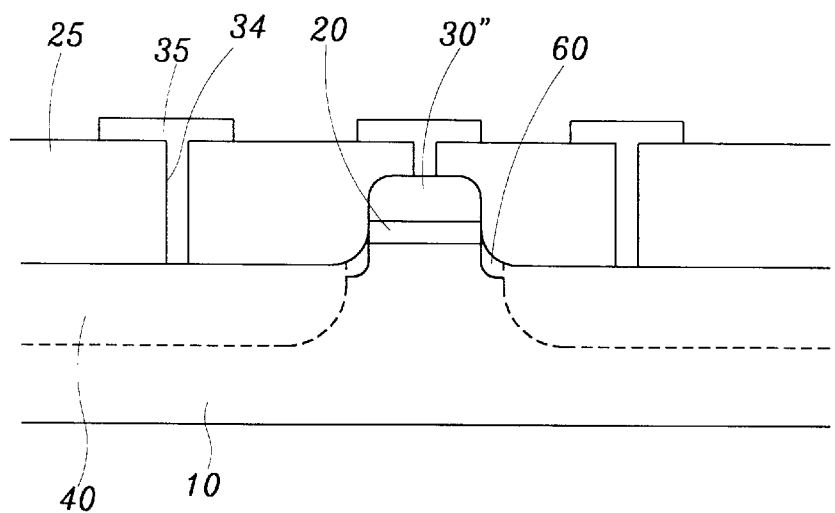

Finally, referring to FIG. 2f, an insulating layer 25 is deposited on the substrate 10 to cover the gate conductor 30", and is then etched such that contact holes 34 are formed. Next, an electrode pattern 35 is formed on the insulating layer 25 through a sputtering process such that the electrode pattern 35 contacts the gate conductor 30" and the heavily doped source/drain region 40 through the contact holes 34.

While this invention has been described in connection with the aforementioned embodiments, it is to be understood that the invention is not limited to the disclosed embodiments, but, on the contrary, is intended to cover various modifications and equivalent arrangements included within the spirit and scope of the appended claims.

What is claimed is:

1. A method for fabricating an LDD MOS transistor, comprising the steps of:

forming a gate conductor on a gate oxide layer formed on a substrate;

forming a first doped source/drain region in the substrate using the gate conductor as the mask;

thermally oxidizing a surface of the gate conductor and the substrate, thereby forming a reduced dimension gate conductor; and forming a second doped source/drain region in the substrate using the oxide covered reduced dimension gate conductor under the oxidized surface as the mask.

2. The method of claim 1 wherein the first doped source/drain region has a higher dopant concentration than the second doped source/drain region.

3. The method of claim 1 wherein said step of forming a second doped source/drain region in the substrate comprises the step of:

implanting a first dopant of a first impurity type into the substrate through the thermally oxidized surface of the substrate using a high implant energy while using the reduced dimension gate conductor as a mask.

4. The method of claim 3 wherein said high implant energy is in the range of 400–900 keV.

5. The method of claim 4 wherein said implanting step uses an impurity dose in the range of 1E12–1E13 ions/cm$^2$.

6. The method of claim 3 wherein said step of forming a first doped source/drain region in the substrate comprises the step of:

implanting a second dopant of the first impurity type into the substrate.

7. The method of claim 6 wherein said step of implanting a second dopant is performed at an implant energy in the range of 40–80 keV and using an impurity dose in the range of 1E14–1E18 ions/cm$^2$.

8. The method of claim 1, further comprising the step of:

removing the oxidized surface of the gate conductor and the substrate to expose the reduced dimension gate conductor.

9. The method of claim 8, further comprising the steps of:

forming an insulating layer on the reduced dimension gate conductor and the substrate; and forming contact holes in the insulating layer for contacting the first doped source/drain region and the reduced dimension gate conductor.

10. The method of claim 1 wherein a thickness of the thermally oxidized surface of the gate conductor and the substrate is in the range of 500 Å~5000 Å.

11. The method of claim 1 wherein the gate conductor comprises a polysilicon layer.

12. A method for fabricating an LDD MOS transistor, comprising the steps of:

forming a gate conductor on a gate oxide layer formed on a substrate;

forming a first doped source/drain region in the substrate using the gate conductor as a mask;

thermally oxidizing a surface of the gate conductor and the substrate, thereby forming a reduced dimension gate conductor;

removing the oxidized surface of the gate conductor and the substrate to expose the reduced dimension gate conductor; and forming a second doped source/drain region in the substrate using the exposed reduced dimension gate conductor as a mask.

13. The method of claim 12 wherein the first doped source/drain region has a higher dopant concentration than the second doped source/drain region.

14. The method of claim 12 wherein said step of forming a second doped source/drain region in the substrate comprises the step of:

implanting a first dopant of a first impurity type into the substrate using a low implant energy while using the reduced dimension gate conductor as a mask.

15. The method of claim 14 wherein said low implant energy is in the range of 20–100 keV.

16. The method of claim 15 wherein said implanting step uses an impurity dose in the range of 1E12–1E14 ions/cm$^2$.

17. The method of claim 14 wherein said step of forming a first doped source/drain region in the substrate comprises the step of:

implanting a second dopant of the first impurity type into the substrate.

18. The method of claim 17 wherein said step of implanting a second dopant is performed at an implant energy in the range of 40–80 keV and using an impurity dose in the range of 1E14–1E18 ions/cm$^2$.

19. The method of claim 12, further comprising the steps of:

forming an insulating layer on the reduced dimension gate conductor and the substrate; and forming contact holes in the insulating layer for contacting the first doped source/drain region and the reduced dimension gate conductor.

20. The method of claim 12 wherein a thickness of the thermally oxidized surface of the gate conductor and the substrate is in the range of 500 Å–5000 Å.

21. The method of claim 12 wherein the gate conductor comprises a polysilicon layer.

* * * * *